US011335888B2

(12) United States Patent
Lee et al.

(10) Patent No.: US 11,335,888 B2
(45) Date of Patent: May 17, 2022

(54) ELECTROLUMINESCENT DISPLAY APPARATUS

(71) Applicant: LG Display Co., Ltd., Seoul (KR)

(72) Inventors: YongBaek Lee, Paju-si (KR); Ho-Jin Kim, Paju-si (KR); Hansun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 56 days.

(21) Appl. No.: 16/905,508

(22) Filed: Jun. 18, 2020

(65) Prior Publication Data

US 2021/0050555 A1 Feb. 18, 2021

(30) Foreign Application Priority Data

Aug. 12, 2019 (KR) ........................ 10-2019-0098203

(51) Int. Cl.
  *G09G 3/30* (2006.01)
  *H01L 51/52* (2006.01)
  *H01L 51/00* (2006.01)
  *H01L 27/32* (2006.01)

(52) U.S. Cl.
  CPC ...... *H01L 51/5256* (2013.01); *H01L 27/3262* (2013.01); *H01L 27/3276* (2013.01); *H01L 51/0096* (2013.01); *H01L 51/5203* (2013.01)

(58) Field of Classification Search
  USPC ............................................ 345/76, 204, 8
  See application file for complete search history.

(56) References Cited

U.S. PATENT DOCUMENTS

| 7,391,151 | B2 | 6/2008 | Koo et al. |
| 7,815,479 | B2 | 10/2010 | Koo et al. |
| 8,637,894 | B2 | 1/2014 | Lee et al. |
| 9,219,081 | B2 | 12/2015 | Nagasawa et al. |
| 9,373,671 | B2 | 6/2016 | You |
| 9,406,898 | B2 | 8/2016 | Yamazaki et al. |

(Continued)

FOREIGN PATENT DOCUMENTS

| CN | 102487071 A | 6/2012 |
| CN | 108987436 A | 12/2018 |

(Continued)

OTHER PUBLICATIONS

Taiwan Intellectual Property Office, Office Action, TW Patent Application No. 109126564, dated May 13, 2021, 12 pages.

(Continued)

*Primary Examiner* — Thuy N Pardo
(74) *Attorney, Agent, or Firm* — Fenwick & West LLP

(57) ABSTRACT

Disclosed is an electroluminescent display device comprising an a substrate including a display area and a non-display area, an emission device in the display area on the substrate, an encapsulation layer extending from the display area to the non-display area, wherein the encapsulation layer is provided on the emission device, a plurality of pad electrodes in the non-display area on the substrate, and a protection layer provided in the area between each of the plurality of pad electrodes, and configured to protect an insulating layer disposed there below, wherein the encapsulation layer is provided with an opening area configured to expose at least a portion in each of the plurality of pad electrodes and at least a portion of the protection layer.

20 Claims, 13 Drawing Sheets

(56) References Cited

U.S. PATENT DOCUMENTS

| | | |
|---|---|---|
| 9,548,346 B2 | 1/2017 | Nagasawa et al. |
| 9,712,651 B2 | 7/2017 | Nagasawa et al. |
| 9,741,778 B2 | 8/2017 | You |
| 9,848,070 B2 | 12/2017 | Yamazaki et al. |
| 10,069,098 B2 | 9/2018 | Kim et al. |
| 10,283,571 B2 | 5/2019 | Kim et al. |
| 10,341,475 B2 | 7/2019 | Nagasawa et al. |
| 10,347,866 B1* | 7/2019 | Kim ............... H01L 51/5246 |
| 10,423,259 B2* | 9/2019 | Yang ............... H01L 27/3276 |
| 10,452,181 B2 | 10/2019 | Hanari |
| 10,468,611 B2 | 11/2019 | Seo et al. |
| 10,777,620 B2 | 9/2020 | Won et al. |
| 10,797,120 B2 | 10/2020 | Zhang |
| 10,811,640 B2* | 10/2020 | Yug ............... H01L 51/003 |
| 10,903,286 B2 | 1/2021 | Kato |
| 10,924,595 B2 | 2/2021 | Yamazaki et al. |
| 11,074,025 B2 | 7/2021 | Hirakata |
| 11,095,763 B2 | 8/2021 | Yamazaki et al. |
| 2004/0119398 A1 | 6/2004 | Koo et al. |
| 2008/0220683 A1 | 9/2008 | Koo et al. |
| 2011/0291119 A1* | 12/2011 | Ryu ............... H01L 51/524 257/88 |
| 2012/0139000 A1* | 6/2012 | Lee ............... H01L 27/3276 257/99 |
| 2014/0063364 A1 | 3/2014 | Hirakata |
| 2014/0209914 A1 | 7/2014 | Nagasawa et al. |
| 2014/0306260 A1 | 10/2014 | Yamazaki et al. |
| 2015/0115256 A1 | 4/2015 | You |
| 2016/0035815 A1 | 2/2016 | Nagasawa et al. |
| 2016/0269515 A1 | 9/2016 | Yamazaki et al. |
| 2016/0284777 A1* | 9/2016 | You ............... H01L 27/124 |
| 2017/0104857 A1 | 4/2017 | Nagasawa et al. |
| 2017/0154930 A1 | 6/2017 | Kim et al. |
| 2017/0289325 A1 | 10/2017 | Nagasawa et al. |
| 2018/0006258 A1 | 1/2018 | Kim et al. |
| 2018/0033829 A1 | 2/2018 | Oh |
| 2018/0040837 A1 | 2/2018 | Seo et al. |
| 2018/0053810 A1* | 2/2018 | Jin ............... G06F 3/04164 |
| 2018/0061907 A1 | 3/2018 | Kim et al. |
| 2018/0083211 A1* | 3/2018 | Lee ............... H01L 27/3246 |
| 2018/0088713 A1* | 3/2018 | Yang ............... H01L 27/323 |
| 2018/0107316 A1* | 4/2018 | Hanari ............... G06F 3/04164 |
| 2018/0139312 A1 | 5/2018 | Yamazaki et al. |
| 2018/0145124 A1* | 5/2018 | Kim ............... H01L 27/3248 |
| 2018/0182818 A1 | 6/2018 | Kim |
| 2018/0190740 A1 | 7/2018 | Bang et al. |
| 2018/0191880 A1 | 7/2018 | Nagasawa et al. |
| 2018/0218658 A1* | 8/2018 | Kim ............... G09G 3/2092 |
| 2018/0308903 A1* | 10/2018 | Jeong ............... G06F 3/0445 |
| 2018/0350884 A1 | 12/2018 | Won et al. |
| 2019/0103450 A1 | 4/2019 | Heo |
| 2019/0124188 A1 | 4/2019 | Yamazaki et al. |
| 2019/0259977 A1* | 8/2019 | Yug ............... H01L 51/003 |
| 2019/0348476 A1 | 11/2019 | Kato |
| 2019/0348478 A1* | 11/2019 | Kim ............... H01L 27/3223 |
| 2020/0028103 A1* | 1/2020 | Seo ............... H01L 27/3262 |
| 2020/0105840 A1* | 4/2020 | Choi ............... H01L 51/5253 |
| 2020/0185468 A1 | 6/2020 | Zhang |
| 2020/0258963 A1* | 8/2020 | Lhee ............... H01L 51/5253 |
| 2020/0373362 A1 | 11/2020 | Won et al. |
| 2021/0004108 A1* | 1/2021 | Gwon ............... G06F 3/0416 |
| 2021/0036267 A1* | 2/2021 | Yug ............... H01L 51/0097 |
| 2021/0098538 A1 | 4/2021 | Kato |
| 2021/0149524 A1* | 5/2021 | Bang ............... G06F 3/0445 |
| 2021/0193787 A1* | 6/2021 | Won ............... H01L 27/3246 |
| 2021/0227061 A1 | 7/2021 | Yamazaki et al. |
| 2021/0263619 A1 | 8/2021 | Hirakata |
| 2021/0271137 A1* | 9/2021 | Song ............... H01L 27/3276 |

FOREIGN PATENT DOCUMENTS

| | | |
|---|---|---|
| CN | 109616580 A | 4/2019 |
| JP | 2004-207218 A | 7/2004 |
| JP | 2014-063484 A | 4/2014 |
| JP | 2014-145857 A | 8/2014 |
| JP | 2017-033950 A | 2/2017 |
| JP | 2017-103226 A | 6/2017 |
| JP | 2018-006316 A | 1/2018 |
| JP | 2018-063669 A | 4/2018 |
| JP | 2018-073760 A | 5/2018 |
| JP | 2018-124816 A | 8/2018 |
| KR | 10-2007-0021062 A | 2/2007 |
| KR | 10-2018-0016681 A | 2/2018 |
| TW | 201523841 A | 6/2015 |

OTHER PUBLICATIONS

Japan Patent Office, Office Action, JP Patent Application No. 2020-135512, dated Jun. 29, 2021, 16 pages.

Intellectual Property Office of the United Kingdom, Office Action, GB Patent Application No. 2012392.3, dated Apr. 13, 2021, ten pages.

Japan Patent Office, Office Action, JP Patent Application No. 2020-135512, dated Dec. 21, 2021, 15 pages.

\* cited by examiner

ELECTROLUMINESCENT DISPLAY APPARATUS

CROSS-REFERENCE TO RELATED APPLICATIONS

This application claims the benefit of the Republic of Korea Patent Application No. 10-2019-0098203 filed on Aug. 12, 2019, which is hereby incorporated by reference in its entirety.

TECHNICAL FIELD

The present disclosure relates to an electroluminescent display device, and more particularly, to a method for exposing a pad electrode.

BACKGROUND

An electroluminescent display device is provided in such a way that an emission layer is provided between an anode electrode and a cathode electrode, and the emission layer emits light by an electric field generated between the above two electrodes, to thereby display an image.

The emission layer may be formed of an organic material which emits light when exciton is produced by a bond of electron and hole, and the exciton falls to a ground state from an excited state, or may be formed of an inorganic material such as quantum dot.

In order to make the emission layer emit light, various circuit devices are provided, wherein the circuit device may be driven by an external driving signal applied via a pad electrode. That is, an external driving device is connected with the pad electrode, whereby a driving signal generated in the external driving device may be transmitted to the circuit device via the pad electrode.

Accordingly, in order to connect the pad electrode with the external driving device, an upper surface of the pad electrode is externally exposed. In this case, when the upper surface of the pad electrode is externally exposed, it may have a problem related with damages on the periphery of the pad electrode.

SUMMARY

The present disclosure has been made in view of the above problems, and it is an object of the present disclosure to provide an electroluminescent display device which is capable of realizing the reduction of manufacturing cost and exposing an upper surface of a pad electrode without any damage on its periphery.

In accordance with an aspect of the present disclosure, the above and other objects can be accomplished by the provision of an electroluminescent display device comprising a substrate including a display area and a non-display area, an emission device in the display area on the substrate, an encapsulation layer extending from the display area to the non-display area, wherein the encapsulation layer is provided on the emission device, a plurality of pad electrodes in the non-display area on the substrate, and a protection layer provided in the area between each of the plurality of pad electrodes, and configured to protect an insulating layer disposed there below, wherein the encapsulation layer is provided with an opening area configured to expose at least a portion in each of the plurality of pad electrodes and at least a portion of the protection layer.

In accordance with another aspect of the present disclosure, there is provided an electroluminescent display device comprising a substrate including a display area and a non-display area, a thin film transistor provided in the display area on the substrate, and configured to include an active layer, a gate electrode, a source electrode and a drain electrode, a pad electrode provided in the non-display area on the substrate, and disposed in the same layer as the source and drain electrodes, a passivation layer extending from the display area to the non-display area, wherein the passivation layer is provided on the thin film transistor, a protection layer provided on the passivation layer of the non-display area, a planarization layer provided on the passivation layer of the display area, an emission device provided in the planarization layer, and an encapsulation layer extending from the display area to the non-display area, wherein the encapsulation layer is provided on the emission device, wherein the encapsulation layer is provided with an opening area for exposing at least a portion of the pad electrode and at least a portion of the protection layer.

BRIEF DESCRIPTION OF THE DRAWINGS

The above and other objects, features and other advantages of the present disclosure will be more clearly understood from the following detailed description taken in conjunction with the accompanying drawings. In the drawings.

DETAILED DESCRIPTION

Figure 1:
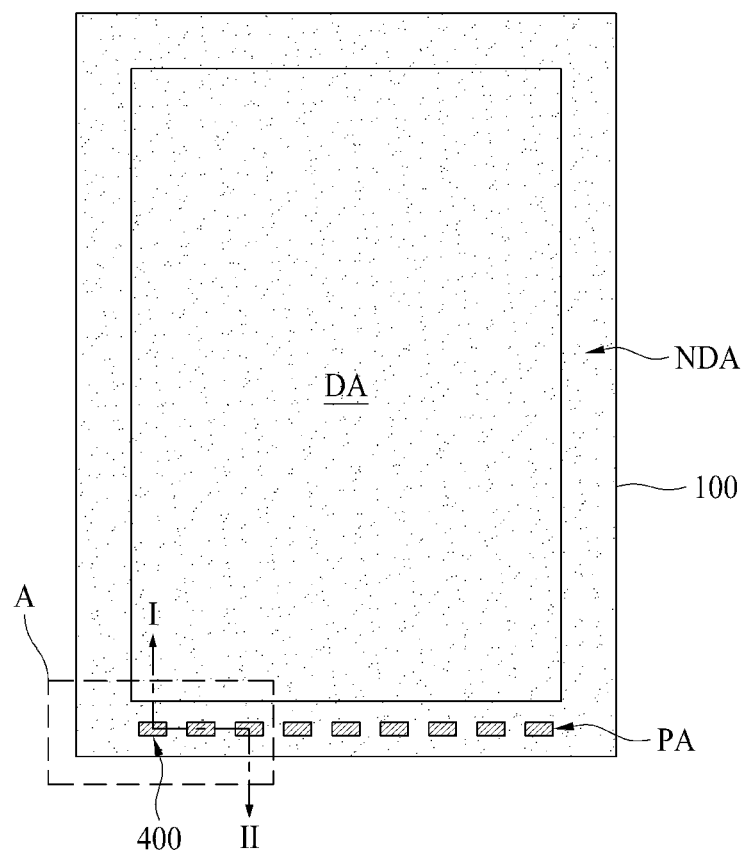
FIG. 1 is a plane view illustrating an electroluminescent display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a plane view illustrating an electroluminescent display device according to one embodiment of the present disclosure.

As shown in FIG. 1, the electroluminescent display device according to one embodiment of the present disclosure may include a display area (DA) and a non-display area (NDA) on a substrate 100.

In the display area (DA), there are a plurality of sub pixels. In each of the plurality of sub pixels, there is a circuit device and an emission device.

The circuit device comprises various signal lines, thin film transistors and a capacitor. The signal lines may include a gate line, a data line, a power source line and a reference line, and the thin film transistors may include a switching thin film transistor, a driving thin film transistor and a sensing thin film transistor.

The switching thin film transistor is switched by a gate signal supplied to the gate line, and the switching thin film transistor supplies a data voltage, which is supplied from the data line, to the driving thin film transistor. The driving thin film transistor is switched by the data voltage supplied from the switching thin film transistor, and the driving thin film transistor generates a data current from power source supplied from the power source line, and supplies the data current to a first electrode of an organic light emitting device. The sensing thin film transistor senses a deviation of threshold voltage in the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period, and the capacitor is connected with each of gate and source terminals of the driving thin film transistor.

The emission device may comprise the organic light emitting device driven by the circuit device, wherein the organic light emitting device may comprise a first electrode, a second electrode and an emission layer provided between the first electrode and the second electrode.

The non-display area (NDA) is provided in the periphery of the display area (DA). That is, the non-display area (NDA) is prepared in the upper, lower, right and left peripheral sides of the display area (DA). The non-display area (NDA) may comprise a pad area (PA). The pad area (PA) may be provided in the lower peripheral side of the display area (DA), but not limited to this structure. The pad area (PA) may be provided in the upper, right or left peripheral side of the display area (DA). If needed, the pad area (PA) may be prepared in at least two among the upper, lower, right and left peripheral sides of the display area (DA).

A plurality of pad electrodes 400 may be provided in the pad area (PA). The plurality of pad electrodes 400 are connected with the various signal lines provided in the display area (DA), for example, gate line, data line, power source line or reference line via a plurality of link lines. Accordingly, a driving signal applied from an external driving circuit may be transmitted to the various signal lines provided in the display area (DA) via the plurality of pad electrodes 400. In order to connect the external driving circuit with the plurality of pad electrodes 400, a contact area is prepared in an upper surface of the plurality of pad electrodes 400, whereby at least a portion of the upper surface of the plurality of pad electrodes 400 may be exposed to the external via the contact area.

Figure 2:
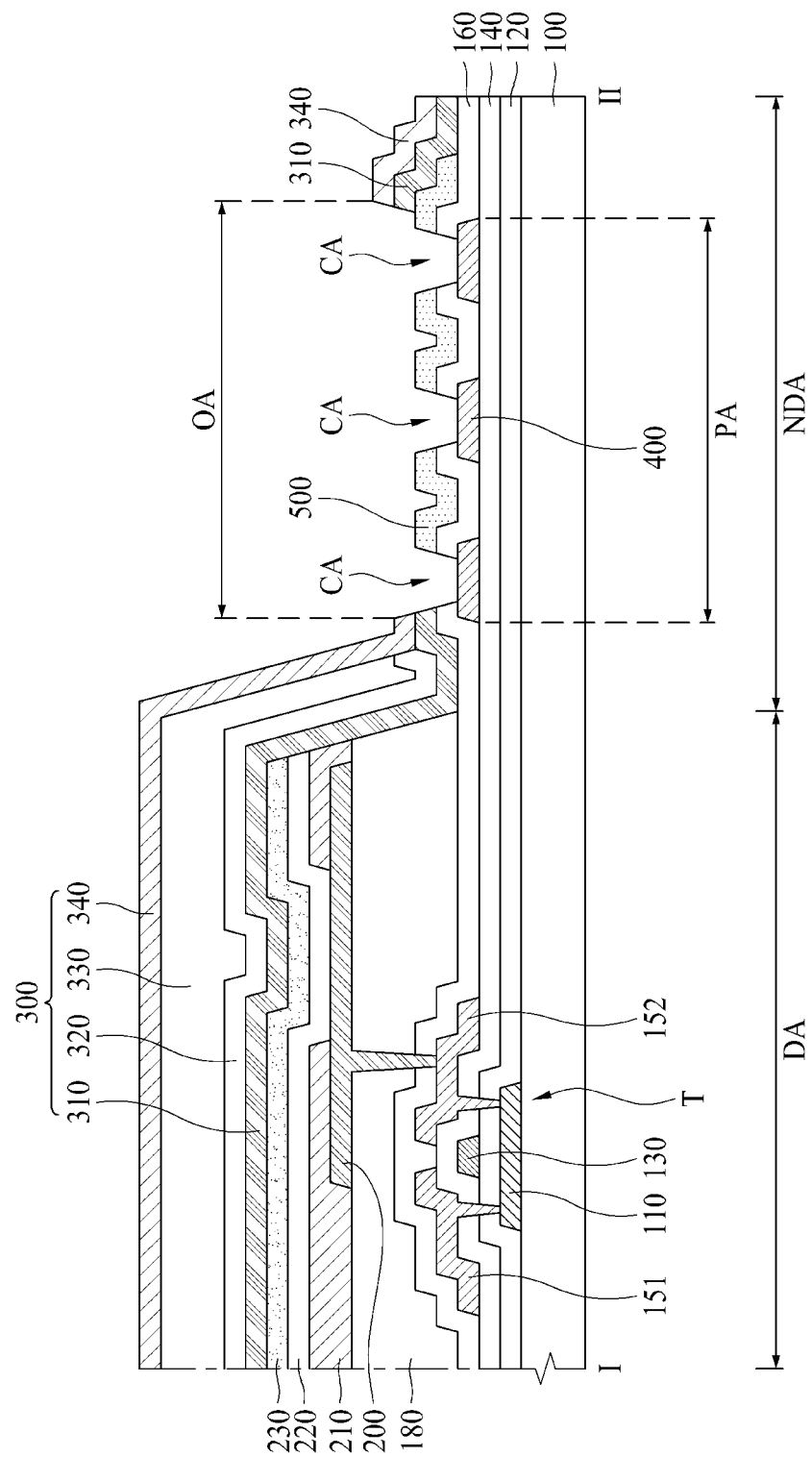
FIG. 2 is a cross sectional view illustrating the electroluminescent display device according to one embodiment of the present disclosure, which corresponds to a cross sectional view along I-II line of FIG. 1.

FIG. 2 is a cross sectional view illustrating the electroluminescent display device according to one embodiment of the present disclosure, which corresponds to a cross sectional view along I-II line of FIG. 1.

As shown in FIG. 2, the driving thin film transistor (T) is provided in the display area (DA) on the substrate 100.

The substrate 100 may be formed of glass or plastic, but not limited to these materials. The substrate 100 may be formed of a semiconductor material such as silicon wafer. The substrate 100 may be formed of a transparent material or an opaque material.

The driving thin film transistor (T) may comprise an active layer 110, a gate insulating layer 120, a gate electrode 130, an insulating interlayer 140, a source electrode 151 and a drain electrode 152. The active layer 110 is formed on the substrate 100, the gate insulating layer 120 is formed on the active layer 110, the gate electrode 130 is formed on the gate insulating layer 120, the insulating interlayer 140 is formed on the gate electrode 130, and the source and drain electrodes 151 and 152 are provided on the insulating interlayer 140, wherein the source and drain electrodes 151 and 152 confront each other.

The gate insulating layer 120 and the insulating interlayer 140 may be formed of an inorganic insulating material, and may extend to the non-display area (NDA). Especially, the gate insulating layer 120 and the insulating interlayer 140 may extend to the end of the substrate 100 of the non-display area (NDA).

The source electrode 151 is connected with one side of the active layer 110 via a contact hole provided on the gate insulating layer 120 and the insulating interlayer 140, and the drain electrode 152 is connected with the other side of the active layer 110 via a contact hole provided on the gate insulating layer 120 and the insulating interlayer 140.

The driving thin film transistor (T) may be formed in a top gate structure where the gate electrode 130 is provided above the active layer 110, but not limited to this structure. It is possible to provide a bottom gate structure where the gate electrode 130 is provided below the active layer 110.

A passivation layer 160 is formed on the source electrode 151 and the drain electrode 152, and a planarization layer 180 is formed on the passivation layer 160.

The passivation layer 160 may be formed of an inorganic insulating layer, and the planarization layer 180 may be formed of an organic insulating layer. The passivation layer 160 extends to the non-display area (NDA), and the planarization layer 180 may not extend to the non-display area (NDA). The passivation layer 160 may extend to the end of the substrate 100 of the non-display area (NDA). The planarization layer 180 may extend to the non-display area (NDA). However, the planarization layer 180 may not extend to the end of the substrate 100 of the non-display area (NDA). Especially, the planarization layer 180 may be provided while being not overlapped with the pad area (PA).

The organic light emitting device including a first electrode 200, a bank 210, an emission layer 220 and a second electrode 230 is formed on the planarization layer 180.

The first electrode 200 is formed on the planarization layer 180. The first electrode 200 may function as an anode. The first electrode 200 may be connected with the drain electrode 152 of the driving thin film transistor (T) via a contact hole provided in the passivation layer 160 and the planarization layer 180. If needed, the first electrode 200 may be connected with the source electrode 151 of the driving thin film transistor (T) via a contact hole provided in the passivation layer 160 and the planarization layer 180.

The bank 210, which covers the periphery of the first electrode 200, is formed as a matrix configuration in the boundary between each of the plurality of sub pixels, to thereby define an emission area in each individual sub pixel. That is, an exposed portion of the first electrode 200 which is not covered by the bank 210 becomes the emission area.

The emission layer 220 may be provided in the plurality of sub pixel areas, and may be provided in the boundary area between each of the plurality of sub pixels. That is, the emission layer 220 may be formed on the first electrode 200 and the bank 210. The emission layer 220 may be configured to emit white (W) colored light. To this end, the emission layer 220 may include a plurality of stacks for emitting different colored light.

The second electrode 230 is formed on the emission layer 220. The second electrode 230 may function as a cathode. In the same manner as the emission layer 220, the second electrode 230 may be provided in the plurality of sub pixel areas, and may be provided in the boundary area between each of the plurality of sub pixels.

The electroluminescent display device according to one embodiment of the present disclosure may be formed in a top emission type. In this case, the second electrode 230 may include a transparent conductive material for upwardly transmitting light emitted from the emission layer 220. Also, the second electrode 230 may be formed of a semi-transparent electrode, whereby it is possible to obtain a micro-cavity effect by each sub pixel. If the second electrode 230 is formed of the semi-transparent electrode, the micro-cavity effect may be obtained through repetitive reflection and re-reflection of the light between the second electrode 230 and the first electrode 200, to thereby improve a light efficiency. In order to obtain the micro-cavity effect, the first electrode 200 may include a reflective electrode. Especially, the first electrode 200 may include a lower reflective electrode and an upper transparent electrode. In this case, the reflective electrode and the transparent electrode may be spaced from each other under the condition a dielectric is interposed in-between.

An encapsulation layer 300 is formed on the second electrode 230. The encapsulation layer 300 may include a first encapsulation layer 310, a second encapsulation layer 320, a third encapsulation layer 330, and a fourth encapsulation layer 340.

The first encapsulation layer 310 is formed on the second electrode 230, the second encapsulation layer 320 is formed on the first encapsulation layer 310, the third encapsulation layer 330 is formed on the second encapsulation layer 320, and the fourth encapsulation layer 340 is formed on the third encapsulation layer 330.

The first encapsulation layer 310 may extend to the non-display area (NDA). Especially, the first encapsulation layer 310 may extend to the end of the substrate 100 of the non-display area (NDA), however, the first encapsulation layer 310 is not formed in the pad area (PA). The second encapsulation layer 320 may extend to the non-display area (NDA), however, the second encapsulation layer 320 does not extend to the end of the substrate 100 of the non-display area (NDA). Especially, the second encapsulation layer 320 is not formed in the pad area (PA). In the same manner as the pattern of the first encapsulation layer 310, the second encapsulation layer 320 may extend to the end of the substrate 100 of the non-display area (NDA). If needed, it is possible to omit the second encapsulation layer 320. The third encapsulation layer 330 may extend to the non-display area (NDA), however, the third encapsulation layer 330 does not extend to the end of the substrate 100 of the non-display area (NDA). Especially, the third encapsulation layer 330 is not formed in the pad area (PA). The fourth encapsulation layer 340 may extend to the non-display area (NDA). Especially, the fourth encapsulation layer 340 may extend to the end of the substrate 100 of the non-display area (NDA), however, the fourth encapsulation layer 340 is not formed in the pad area (PA). The fourth encapsulation layer 340 may be formed in the same pattern as that of the first encapsulation layer 310.

The encapsulation layer 300 may be formed in an alternate stack structure of inorganic and organic insulating layers. To this end, each of the first to fourth encapsulation layers 310, 320, 330 and 340 may be formed of the inorganic insulating layer or organic insulating layer. Especially, the first and fourth encapsulation layers 310 and 340 which extend to the end of the substrate 100 may be formed of the inorganic insulating layer, and the third encapsulation layer 330 which does not extend to the end of the substrate 100 may be formed of the organic insulating layer.

In the non-display area (NDA) of the substrate 100, the gate insulating layer 120 and the insulating interlayer 140 are sequentially formed thereon, and the pad electrode 400 is formed on the insulating interlayer 140. The pad electrode 400 is formed of the same material as those of the source electrode 151 and the drain electrode 152, and the pad electrode 400, the source electrode 151 and the drain electrode 152 may be manufactured by the same process, but not limited to this method.

The passivation layer 160 is formed on the pad electrode 400. The passivation layer 160 exposes a portion of an upper surface of the pad electrode 400, and the passivation layer 160 is overlapped with one side of the pad electrode 400 and the other side of the pad electrode 400. That is, a portion of the passivation layer 160 is removed from a portion of the upper surface of the pad electrode 400, whereby a contact area (CA) is prepared between the pad electrode 400 and the external driving circuit. The passivation layer 160 extends to the end of the substrate 100 of the non-display area (NDA), and the passivation layer 160 may be overlapped with the end of the substrate 100 of the non-display area (NDA).

A protection layer 500 is formed on an upper surface of the passivation layer 160 provided between each of the plurality of pad electrodes 400. The protection layer 500 protects the passivation layer 160 provided there below. The protection layer 500 may be formed in the same pattern as that of the passivation layer 160 provided there below. The protection layer 500 may be formed of a conductive material, for example, aluminum (Al), indium tin oxide (ITO), indium zinc oxide (IZO) or titanium (Ti). Especially, the protection layer 500 and the first electrode 200 may be formed of the same material and may be manufactured by the same process, but not limited to this method.

Also, the encapsulation layer 300 may be formed on the passivation layer 160 in the non-display area (NDA). The encapsulation layer 300 is removed from the pad area (PA), to thereby form an opening area (OA) obtained by removing the encapsulation layer 300. The opening area (OA) is overlapped with the pad electrode 400 and the protection layer 500. Especially, the opening area (OA) is overlapped with the contact area (CA) from which the passivation layer 160 is removed. Accordingly, the pad electrode 400 and the protection layer 500 may be exposed to the external via the opening area (OA).

The encapsulation layer 300 is formed in the non-display area (NDA), however, the encapsulation layer 300 is not formed in the opening area (OA). Thus, the encapsulation layer 300 may be overlapped with the end of the substrate 100 of the non-display area (NDA). Especially, the encapsulation layer 300 overlapped with the end of the substrate 100 may include the first encapsulation layer 310 of an inorganic insulating material being in contact with the upper surfaces of the passivation layer 160 and the protection layer 500, and the fourth encapsulation layer 340 of an inorganic insulating material being in contact with the first encapsulation layer 310.

Accordingly, a thickness of the encapsulation layer 300 provided in the display area (DA) may be larger than a thickness of the encapsulation layer 300 provided in the non-display area (NDA).

FIGS. 3A to 3D are cross sectional views illustrating a method for manufacturing the electroluminescent display device according to one embodiment of the present disclosure, which relate with a manufacturing process of the aforementioned electroluminescent display device of FIG. 2.

Figure 3A:
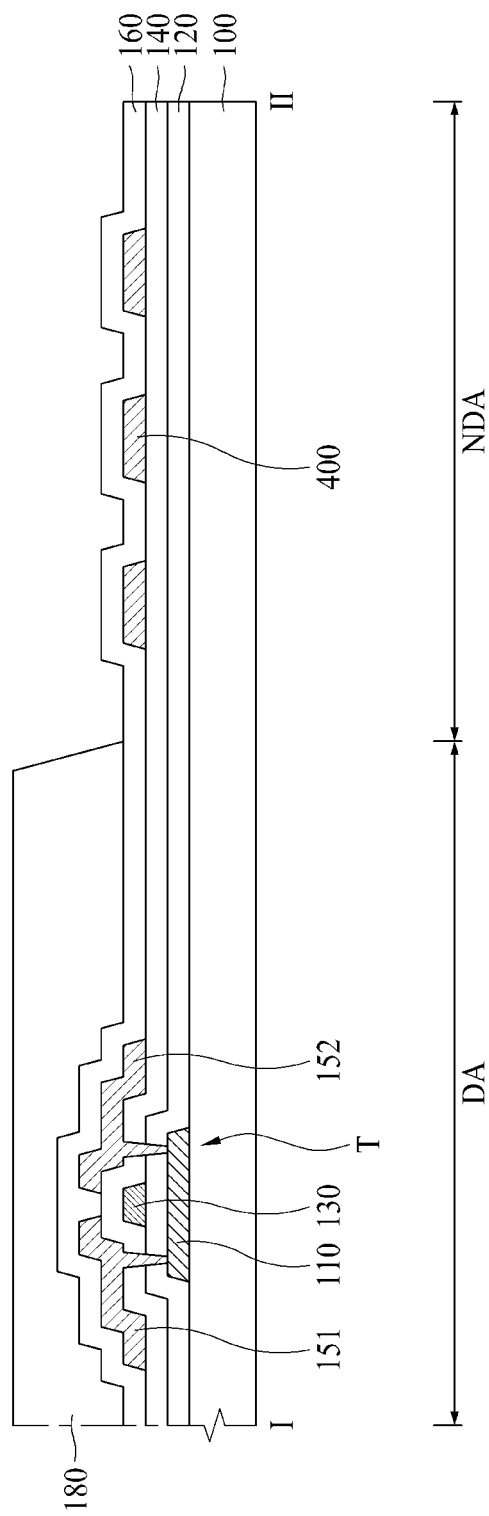
FIGS. 3A to 3D are cross sectional views illustrating a method for manufacturing the electroluminescent display device according to one embodiment of the present disclosure.

First, as shown in FIG. 3A, the active layer 110 is formed on the substrate 100, the gate insulating layer 120 is formed on the active layer 110, the gate electrode 130 is formed on the gate insulating layer 120, the insulating interlayer 140 is formed on the gate electrode 130, the source electrode 151, the drain electrode 152 and the pad electrode 400 are formed on the insulating interlayer 140, the passivation layer 160 is formed on the source electrode 151, the drain electrode 152 and the pad electrode 400, and the planarization layer 180 is formed on the passivation layer 160.

Accordingly, as a contact hole is formed in a predetermined area of the gate insulating layer 120 and the insulating interlayer 140, the source electrode 151 and the drain electrode 152 are connected with one side of the active layer 110 and the other side of the active layer 110 via the contact hole.

The gate insulating layer 120, the insulating interlayer 140 and the passivation layer 160 are formed on the entire display area (DA) and the entire non-display area (NDA). The planarization layer 180 is formed in the display area (DA), and may be formed in a portion of the non-display area (NDA). However, the planarization layer 180 is not overlapped with the pad electrode 400.

Figure 3B:
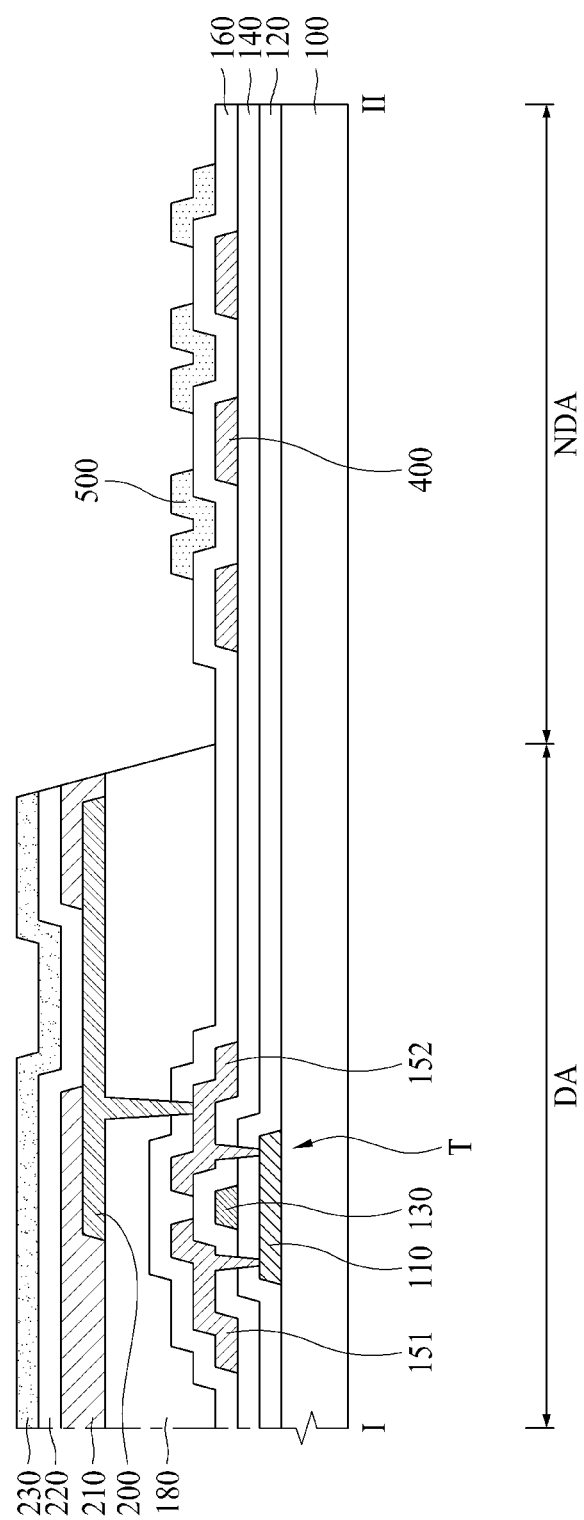

Then, as shown in FIG. 3B, the first electrode 200 is formed on the planarization layer 180, the bank 210 is formed to cover the periphery of the first electrode 200, the emission layer 220 is formed on the first electrode 200 and the bank 210, and the second electrode 230 is formed on the emission layer 220.

Accordingly, as a contact hole is formed in a predetermined area of the passivation layer 160 and the planarization layer 180, the first electrode 200 is connected with the drain electrode 152 or the source electrode 151 via the contact hole.

Also, a protection layer 500 is formed on the passivation layer 160 of the non-display area (NDA). The protection layer 500 is formed on an upper surface of the passivation layer 160 between each of the plurality of pad electrodes 400. The protection layer 500 and the first electrode 200 may be formed of the same material and may be manufactured by the same process, but not limited to this method.

Figure 3C:
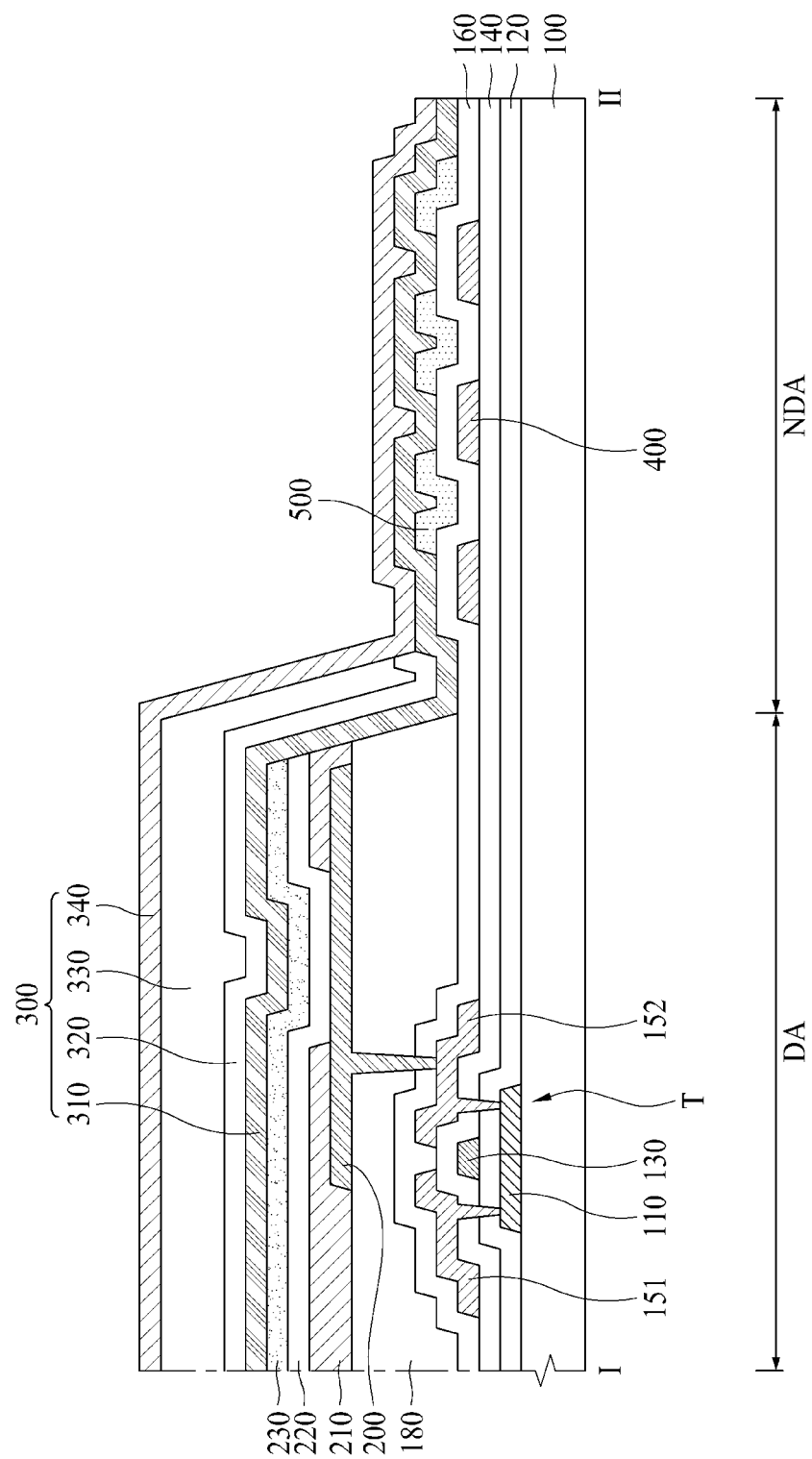

Then, as shown in FIG. 3C, the encapsulation layer 300 is formed on the second electrode 230 of the display area (DA) and the passivation layer 160 of the non-display area (NDA). In detail, the first encapsulation layer 310 is formed on the second electrode 230 of the display area (DA) and the passivation layer 160 of the non-display area (NDA), the second encapsulation layer 320 is formed on the first encapsulation layer 310, the third encapsulation layer 330 is formed on the second encapsulation layer 320, and the fourth encapsulation layer 340 is formed on the third encapsulation layer 330.

The first encapsulation layer 310 is formed in the entire display area (DA) and the entire non-display area (NDA). The second encapsulation layer 320 is formed in the entire display area (DA) and a portion of the non-display area (NDA). Especially, the second encapsulation layer 320 may not be overlapped with the pad electrode 400. The third encapsulation layer 330 is formed in the entire display area (DA) and a portion of the non-display area (NDA). Especially, the third encapsulation layer 330 may not be overlapped with the pad electrode 400. The fourth encapsulation layer 340 is formed in the entire display area (DA) and the entire non-display area (NDA). Thus, in a portion of the non-display area (NDA), the upper surface of the first encapsulation layer 310 is brought into contact with the lower surface of the fourth encapsulation layer 340.

Figure 3D:
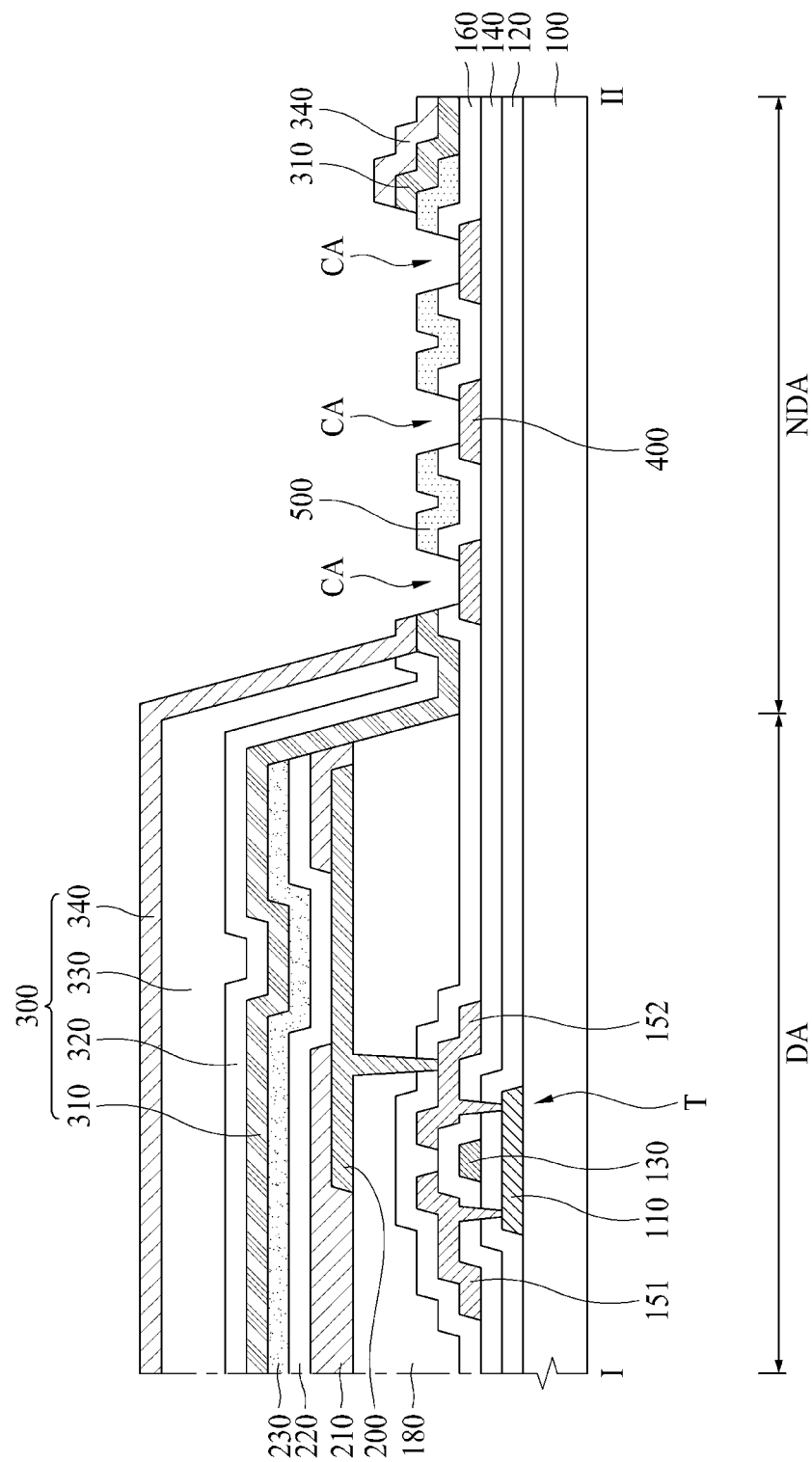

Then, as shown in FIG. 3D, the encapsulation layer 300 provided on the plurality of pad electrodes 400 and the boundary area between each of the pad electrodes 400 is removed, and the passivation layer 160 provided there below is also removed. Thus, the opening area (OA) is formed by removing the encapsulation layer 300, and the contact area (CA) is formed by removing the passivation layer 160 provided below the encapsulation layer 300. However, the protection layer 500 provided in the boundary area between each of the pad electrodes 400 remains without removal, whereby the passivation layer 160 provided below the protection layer 500 also remains.

A process of removing the encapsulation layer 300 and the passivation layer 160 positioned there below may be carried out by a laser ablation process. In this case, there is no requirement for an additional mask. That is, it is advantageous in that it has no additional manufacturing cost for the mask. If performing laser scanning by the laser ablation process, the encapsulation layer 300 and the passivation layer 160 positioned there below are removed, however, the protection layer 500 remains without removal. Generally, a penetration depth of an electromagnetic wave such as laser into an inorganic insulating material is relatively large, whereas a penetration depth of an electromagnetic wave such as laser into a conductive material is relatively small. Thus, if using the protection layer 500 of the conductive material, the protection layer 500 may remain without removal by the laser ablation process. Accordingly, the passivation layer 160 remains below the protection layer 500 so that it is possible to reduce damage to the peripheral area of the pad electrode 400, especially, the periphery of the area between each of the pad electrodes 400.

However, for removing the encapsulation layer 300 and the passivation layer 160 provided there below, it is not always necessary to carry out the laser ablation process. For example, it is possible to carry out a dry etching process for removing the encapsulation layer 300 and the passivation layer 160 provided there below.

According to one embodiment of the present disclosure, the protection layer 500 is formed in the boundary area between each of the plurality of pad electrodes 400, whereby the protection layer 500 and the passivation layer 160 provided there below remain after the process of removing the encapsulation layer 300 and the passivation layer 160 provided there below so as to expose the upper surface in the plurality of pad electrodes 400. Thus, it is possible to reduce damage to the periphery of the area between each of the plurality of pad electrodes 400. In this case, the protection layer 500 is spaced apart from the plurality of pad electrodes 400 under the condition that the passivation layer 160 is interposed in-between, whereby the protection layer 500 is electrically insulated from the plurality of pad electrodes 400.

Figure 4A:
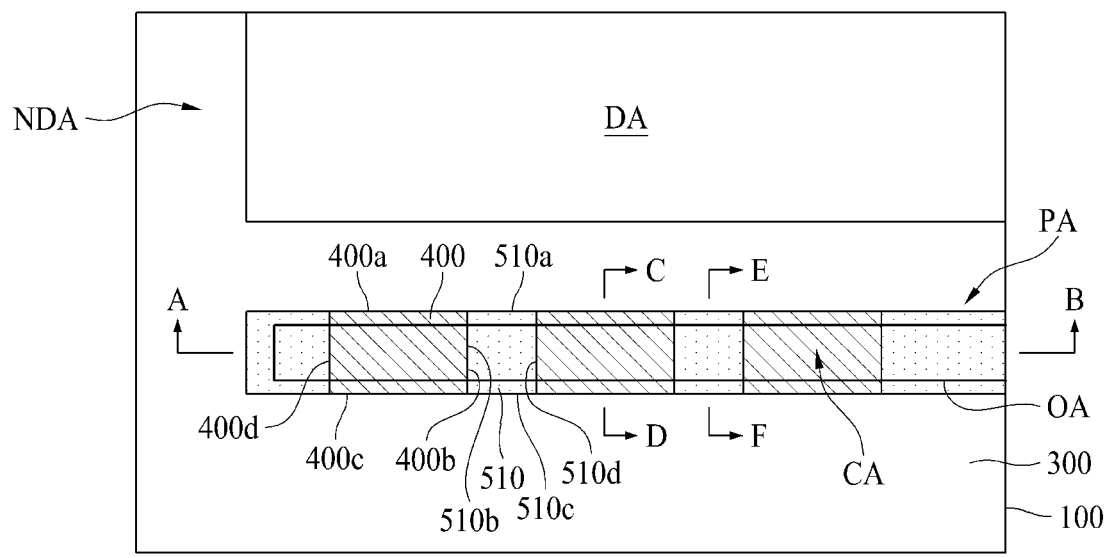
FIG. 4A is a plane view illustrating an electroluminescent display device according to another embodiment of the present disclosure, which corresponds to an expanded view of 'A' area of FIG. 1.

FIG. 4A is a plane view illustrating an electroluminescent display device according to another embodiment of the present disclosure, which corresponds to an expanded view of 'A' area of FIG. 1.

As shown in FIG. 4A, the electroluminescent display device according to another embodiment of the present disclosure includes a display area (DA) and a non-display area (NDA) on a substrate 100. Hereinafter, only different parts, which are different from those of the above embodiment, will be described in detail.

A pad area (PA) is provided in the non-display area (NDA), and a plurality of pad electrodes 400 and a plurality of first protection layers 510 are provided in the pad area (PA).

The plurality of pad electrodes 400 are provided at fixed intervals.

Each of the plurality of pad electrodes 400 includes a first side 400a confronting the display area (DA), a second side 400b extending from the first side 400a and confronting the neighboring pad electrode 400, a third side 400c extending from the second side 400b and being opposite to the first side 400a, and a fourth side 400d extending from the third side 400c and being opposite to the second side 400b. Each of the plurality of pad electrodes 400 is formed in a rectangular-shaped structure.

The plurality of first protection layers 510 are provided at fixed intervals, wherein each of the first protection layers 510 is positioned between each of the pad electrodes 400. Each of the plurality of first protection layers 510 is disposed between the second side 400b of one pad electrode 400 and the fourth side 400d of another neighboring pad electrode 400. Herein, the leftmost positioned first protection layer 510 confronts the fourth side 400d of the leftmost positioned pad electrode 400, and the rightmost positioned first protection layer 510 confronts the second side 400b of the rightmost positioned pad electrode 400.

Each of the plurality of first protection layers 510 includes a first side 510a confronting the display area (DA), a second side 510b extending from the first side 510a and confronting the left-sided pad electrode 400, a third side 510c extending from the second side 510b and being opposite to the first side 510a, and a fourth side 510d extending from the third side 510c and being opposite to the second side 510b. Each of the plurality of first protection layers 510 is formed in a rect-angular-shaped structure.

The first side 510a of the first protection layer 510 and the first side 400a of the pad electrode 400 may be positioned along the same extending line, whereby it is possible to form a straight line by combining the first side 510a in the plurality of first protection layers 510 and the first side 400a in the plurality of pad electrodes 400.

The second side 510b of the first protection layer 510 may coincide with the second side 400b of one-sided pad electrode 400 (for example, left-sided pad electrode), or not. Especially, the second side 510b of the first protection layer 510 extends to an upper portion of the area of the left-sided pad electrode 400 so that the first protection layer 510 may be overlapped with the left-sided pad electrode 400.

The third side 510c of the first protection layer 510 and the third side 400c of the pad electrode 400 may be positioned along the same extending line, whereby it is possible to form a straight line by combining the third side 510c in the plurality of first protection layers 510 and the third side 400c in the plurality of pad electrodes 400.

The fourth side 510d of the first protection layer 510 may coincide with the fourth side 400d of the other-sided pad electrode 400 (for example, right-sided pad electrode), or not. Especially, the fourth side 510d of the first protection layer 510 extends to an upper portion of the area of the right-sided pad electrode 400 so that the first protection layer 510 may be overlapped with the right-sided pad electrode 400.

The first protection layer 510 may be disposed while being not confronting the first side 400a and third side 400c of the pad electrode 400.

An opening area (OA) obtained by removing an encapsulation layer 300 is prepared on the first protection layer 510 and the pad electrode 400, and a contact area (CA) is prepared in an overlap area between the opening area (OA) and the pad electrode 400.

As described above, the opening area (OA) may be an area from which the encapsulation layer 300 is removed by a laser ablation process, and may be an area formed in a straight-line structure while being overlapped with a portion of the plurality of first protection layers 510 and a portion of the plurality of pad electrodes 400.

The opening area (OA) does not extend to the periphery of the first protection layer 510 and the pad electrode 400, whereby the entire opening area (OA) is overlapped with the first protection layer 510 and the pad electrode 400. If the opening area (OA) extends to the periphery of the first protection layer 510 and the pad electrode 400, the encapsulation layer 300 is removed from the area which is not protected by the first protection layer 510, whereby the peripheral area of the pad electrode 400 may be damaged.

The opening area (OA) may be smaller in size than the entire area of the first protection layer 510 and the pad electrode 400, but not limited to this structure. The opening area (OA) may be identical in size to the entire area of the first protection layer 510 and the pad electrode 400.

One end of the opening area (OA), for example, upper end of the opening area (OA) may coincide with the first side 510a of the first protection layer 510 and the first side 400a of the pad electrode 400, or not. Also, the other end of the opening area (OA), for example, lower end of the opening area (OA) may coincide with the third side 510c of the first protection layer 510 and the third side 400c of the pad electrode 400, or not. Also, a lateral end of the opening area (OA) may coincide with the second side 510b or fourth side 510d of the first protection layer 510, or not.

Figure 4B:
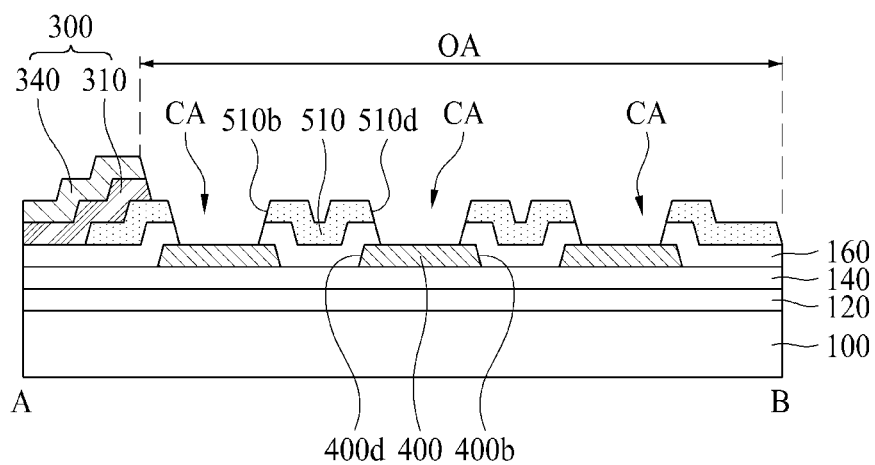
FIG. 4B is a cross sectional view along A-B line of FIG. 4A according to one embodiment of the present disclosure.

FIG. 4B is a cross sectional view along A-B line of FIG. 4A.

As shown in FIG. 4B, a gate insulating layer 120 is formed on the substrate 100, an insulating interlayer 140 is formed on the gate insulating layer 120, and a plurality of pad electrodes 400 are formed on the insulating interlayer 140.

A passivation layer 160 is formed on the plurality of pad electrodes 400, and a first protection layer 510 is formed on the passivation layer 160. Each of second and fourth sides 400b and 400d of the pad electrode 400 is overlapped with the first protection layer 510, and each of second and fourth sides 510b and 510d of the first protection layer 510 is overlapped with the pad electrode 400.

The first protection layer 510 positioned between the adjacent two pad electrodes 400 is formed in the same pattern as that of the passivation layer 160 formed below the first protection layer 510.

An encapsulation layer 300 is formed on the upper surface of the first protection layer 510 provided at one end (for example, leftmost positioned first protection layer). In detail, a first encapsulation layer 310 of an inorganic insulating layer is formed on the upper surface of the first protection layer 510, and a fourth encapsulation layer 340 of an inorganic insulating layer is formed on the first encapsulation layer 310. The encapsulation layer 300 is overlapped with a portion of the leftmost positioned first protection layer 510, however, is not overlapped with the remaining portions of the first protection layer 510 and the pad electrode 400. Thus, an area in which the encapsulation layer 300 is not formed becomes an opening area (OA), and an area for exposing the pad electrode 400 in the opening area (OA) becomes a contact area (CA).

Figure 4C:
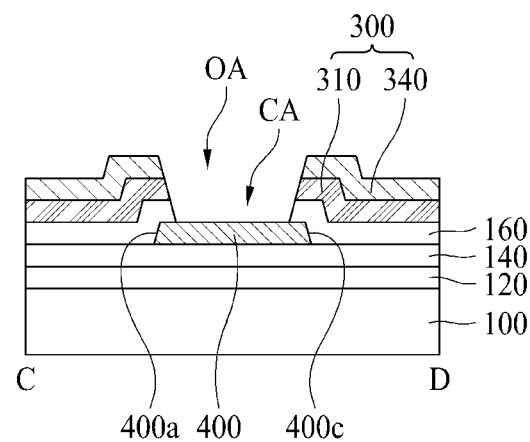
FIG. 4C is a cross sectional view along C-D line of FIG. 4A according to one embodiment of the present disclosure.

FIG. 4C is a cross sectional view along C-D line of FIG. 4A.

As shown in FIG. 4C, a gate insulating layer 120 is formed on the substrate 100, an insulating interlayer 140 is formed on the gate insulating layer 120, and a pad electrode 400 is formed on the insulating interlayer 140.

A passivation layer 160 is formed on the pad electrode 400, and an encapsulation layer 300 is formed on the passivation layer 160.

Each of first and third sides 400a and 400c of the pad electrode 400 is overlapped with the passivation layer 160 and the encapsulation layer 300. An opening area (OA) is formed by removing a portion of the encapsulation layer 300 on the pad electrode 400, and a contact area (CA) for exposing a portion of the upper surface of the pad electrode 400 is prepared by removing a portion of the passivation layer 160 provided on the pad electrode 400. One end of the passivation layer 160 being in contact with the contact area (CA) coincides with one end of the encapsulation layer 300.

The encapsulation layer 300 includes a first encapsulation layer 310 of an inorganic insulating layer provided on the upper surface of the passivation layer 160, and a fourth encapsulation layer 340 of an inorganic insulating layer provided on the upper surface of the first encapsulation layer 310.

Figure 4D:
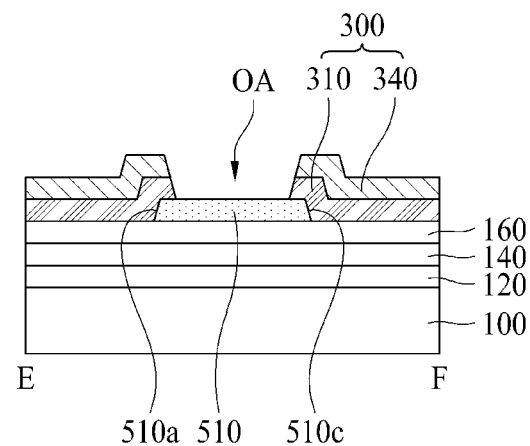
FIG. 4D is a cross sectional view along E-F line of FIG. 4A according to one embodiment of the present disclosure.

FIG. 4D is a cross sectional view along E-F line of FIG. 4A.

As shown in FIG. 4D, a gate insulating layer 120 is formed on the substrate 100, an insulating interlayer 140 is formed on the gate insulating layer 120, a passivation layer 160 is formed on the insulating interlayer 140, and a first protection layer 510 is formed on the passivation layer 160.

An encapsulation layer 300 is formed on the first protection layer 510. The encapsulation layer 300 includes a first encapsulation layer 310 of an inorganic insulating layer provided on the upper surface of the first protection layer 510, and a fourth encapsulation layer 340 of an inorganic insulating layer provided on the upper surface of the first encapsulation layer 310.

Each of first and third sides 510a and 510c of the first protection layer 510 is overlapped with the encapsulation layer 300. An opening area (OA) for exposing a portion of the upper surface of the first protection layer 510 is prepared by removing a portion of the encapsulation layer 300 provided on the first protection layer 510. The first encapsulation layer 310 is patterned in such a way that one end of the first encapsulation layer 310 being in contact with the opening area (OA) coincides with one end of the fourth encapsulation layer 340.

Figure 5A:
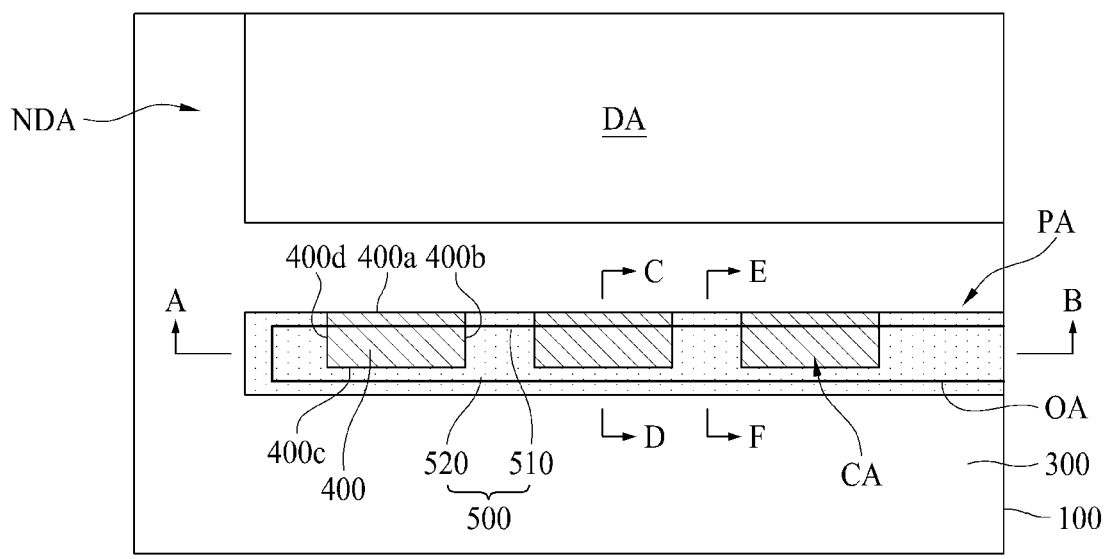
FIG. 5A is a plane view illustrating an electroluminescent display device according to another embodiment of the present disclosure, which corresponds to an expanded view of 'A' area of FIG. 1.

FIG. 5A is a plane view illustrating an electroluminescent display device according to another embodiment of the present disclosure, which corresponds to an expanded view of 'A' area of FIG. 1. Hereinafter, only different parts, which are different from those of FIG. 4A, will be described in detail.

As shown in FIG. 5A, a plurality of pad electrodes 400 and a protection layer 500 are formed on a substrate 100. In the same manner as each of the plurality of pad electrodes 400 shown in FIG. 4A, each of the plurality of pad electrodes 400 shown in FIG. 5A includes a first side 400a, a second side 400b, a third side 400c and a fourth side 400d.

The protection layer 500 includes a plurality of first protection layers 510, and a second protection layer 520 provided to connect the plurality of first protection layers 510 with each other. In the same manner as the plurality of first protection layers 510 shown in FIG. 4A, the first protection layer 510 includes a first side 510a, a second side 510b, a third side 510c and a fourth side 510d.

The second protection layer 520 is in contact with the third side 510c in each of the plurality of first protection layers 510, and also confronts the third side 400c of the pad electrode 400. The first protection layer 510 and the second protection layer 520 are formed of the same material, and are formed as one body. Thus, according to another embodiment of the present disclosure, the protection layer 500 confronts the second side 400b, the third side 400c and the fourth side 400d except the first side 400a of the pad electrode 400.

An opening area (OA) may be formed in a straight-line structure while being overlapped with a portion of the plurality of first protection layers 510, a portion of the second protection layer 520 and a portion of the plurality of pad electrodes 400. However, the opening area (OA) may be not overlapped with the second protection layer 520, whereby the opening area (OA) may be identical in structure to that of the opening area (OA) shown in FIG. 4A.

One end of the opening area (OA), for example, upper end of the opening area (OA) may coincide with the first side 510a of the first protection layer 510 and the first side 400a of the pad electrode 400, or not. Also, the other end of the opening area (OA), for example, lower end of the opening area (OA) may coincide with the lower end of the second protection layer 520, or not. Also, a lateral end of the opening area (OA) may coincide with the second side 510b or fourth side 510d of the first protection layer 510, or not.

According to another embodiment of the present disclosure, the second protection layer 520 is additionally provided so that the entire area of the protection layer 500 is relatively larger in comparison to the case of FIG. 4A. Thus, a process margin for forming the opening area (OA) by removing the encapsulation layer 300 may be large, and a contact area (CA) for exposing the pad electrode 400 to the external may be increased.

Figure 5B:
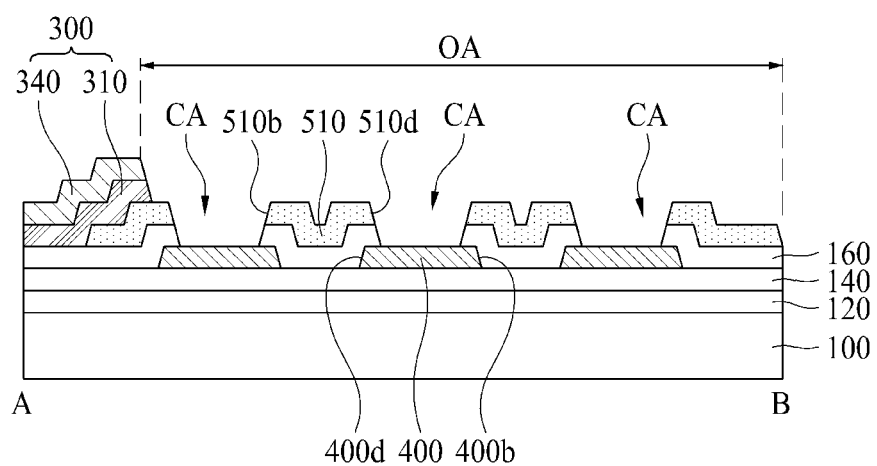
FIG. 5B is a cross sectional view along A-B line of FIG. 5A according to one embodiment of the present disclosure.

FIG. 5B is a cross sectional view along A-B line of FIG. 5A, which is identical to above FIG. 4B, whereby a repetitive description for the same parts will be omitted.

Figure 5C:
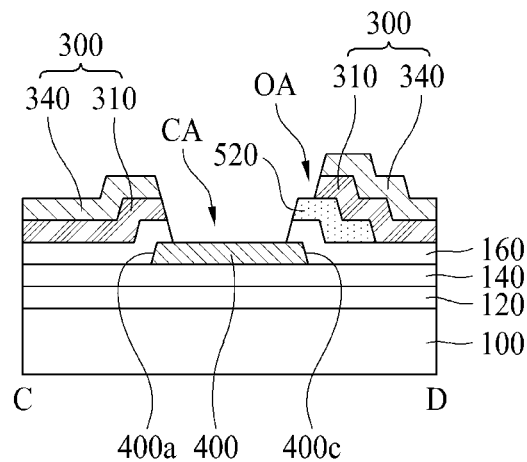
FIG. 5C is a cross sectional view along C-D line of FIG. 5A according to one embodiment of the present disclosure.

FIG. 5C is a cross sectional view along C-D line of FIG. 5A.

As shown in FIG. 5C, a gate insulating layer 120 is formed on the substrate 100, an insulating interlayer 140 is formed on the gate insulating layer 120, a pad electrode 400 is formed on the insulating interlayer 140, and a passivation layer 160 is formed on the pad electrode 400.

An encapsulation layer 300 is formed on the passivation layer 160 positioned above a first side 400a of the pad electrode 400, a second protection layer 520 is formed on the passivation layer 160 positioned above a third side 400c of the pad electrode 400, and an encapsulation layer 300 is formed on the second protection layer 520.

The first side 400a of the pad electrode 400 is overlapped with the passivation layer 160 and the encapsulation layer 300, and the third side 400c of the pad electrode 400 is overlapped with the passivation layer 160 and the second protection layer 520.

An opening area (OA) is prepared by removing a portion of the encapsulation layer 300 provided above the pad electrode 400, and removing a portion of the encapsulation layer 300 provided above the second protection layer 520. Also, a contact area (CA) for exposing a portion of the upper surface of the pad electrode 400 is prepared by removing a portion of the passivation layer 160 provided above the pad electrode 400. The opening area (OA) is relatively larger than the contact area (CA), and the entire contact area (CA) is overlapped with the opening area (OA).

In the vicinity of the first side 400a of the pad electrode 400, the passivation layer 160 is patterned in such a way that one end of the passivation layer 160 coincides with one end of the encapsulation layer 300. However, in the vicinity of the third side 400c of the pad electrode 400, one end of the passivation layer 160 does not coincide with one end of the encapsulation layer 300.

The encapsulation layer 300 includes a first encapsulation layer 310 of an inorganic insulating layer provided on the upper surface of the passivation layer 160, and a fourth encapsulation layer 340 of an inorganic insulating layer provided on the upper surface of the first encapsulation layer 310.

Figure 5D:
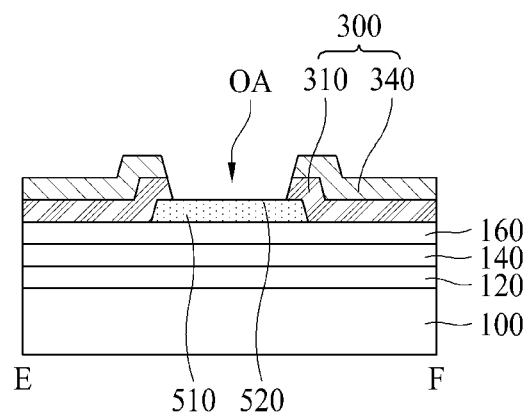
FIG. 5D is a cross sectional view along E-F line of FIG. 5A according to one embodiment of the present disclosure.

FIG. 5D is a cross sectional view along E-F line of FIG. 5A.

As shown in FIG. 5D, a gate insulating layer 120 is formed on the substrate 100, an insulating interlayer 140 is formed on the gate insulating layer 120, a passivation layer 160 is formed on the insulating interlayer 140, and a first protection layer 510 and a second protection layer 520 are formed on the passivation layer 160.

An encapsulation layer 300 is formed on the first protection layer 510 and the second protection layer 520. The encapsulation layer 300 includes a first encapsulation layer 310 of an inorganic insulating layer provided on the upper surface of the first and second protection layers 510 and 520, and a fourth encapsulation layer 340 of an inorganic insulating layer provided on the upper surface of the first encapsulation layer 310.

Each of one end of the first protection layer 510 and one end of the second protection layer 520 is overlapped with the encapsulation layer 300. An opening area (OA) for exposing a portion of the upper surface of the first and second protection layers 510 and 520 is prepared by removing a portion of the encapsulation layer 300 provided above the first and second protection layers 510 and 520. One end of the first encapsulation layer 310 being in contact with the opening area (OA) coincides with one end of the fourth encapsulation layer 340.

Figure 6:
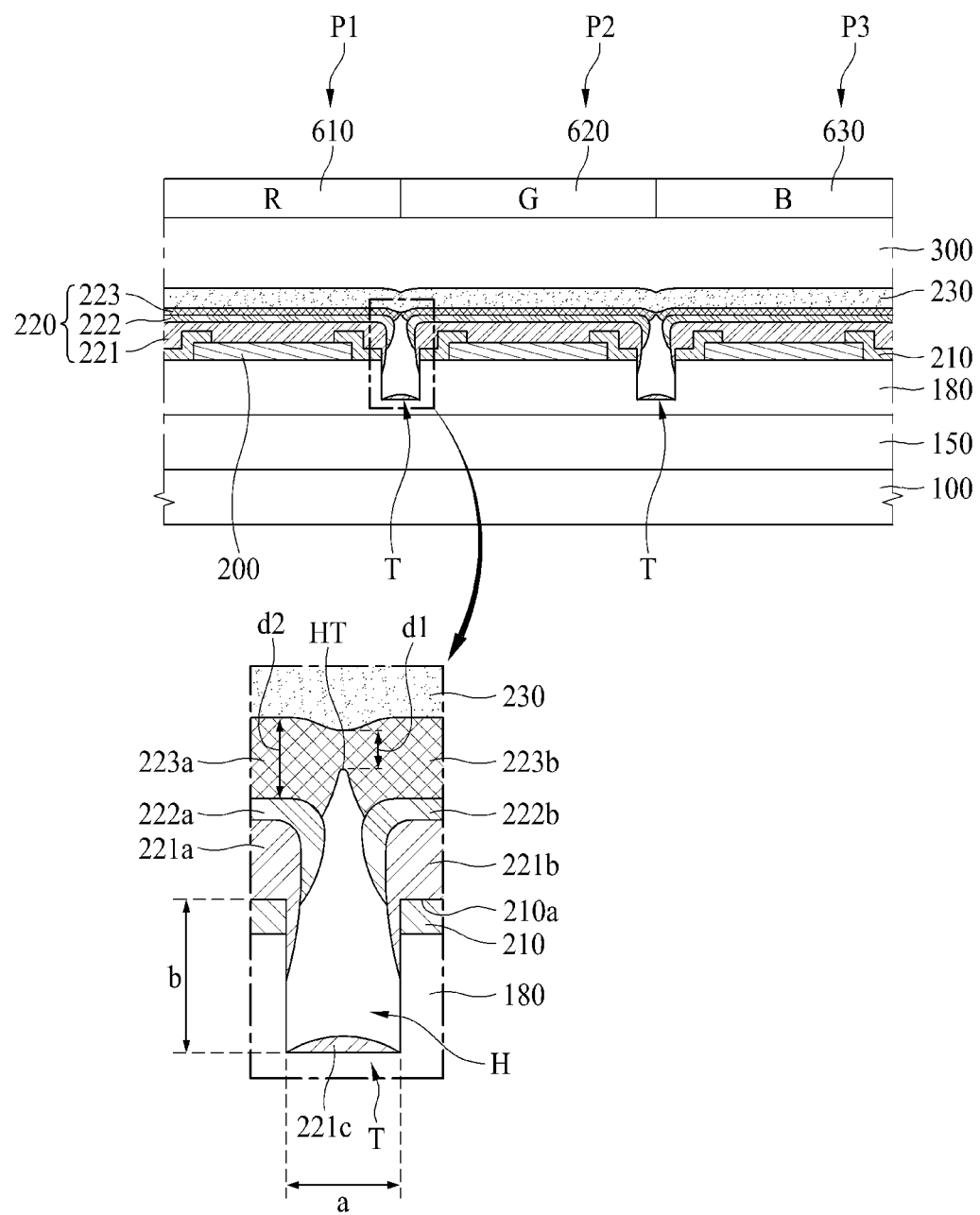
FIG. 6 is a cross sectional view illustrating an electroluminescent display device according to another embodiment of the present disclosure, which corresponds to a cross sectional view of a display area.

FIG. 6 is a cross sectional view illustrating an electroluminescent display device according to another embodiment of the present disclosure, which corresponds to a cross sectional view of a display area.

As shown in FIG. 6, the electroluminescent display device according to another embodiment of the present disclosure includes a substrate 100, a circuit device layer 150, a planarization layer 180, a first electrode 200, a bank 210, an emission layer 220, a second electrode 230, an encapsulation layer 300, and a color filter layer 610, 620 and 630. Hereinafter, only different parts, which are different from those of the above embodiment, will be described in detail.

The circuit device layer 150 is provided on the substrate 100. In the circuit device layer 150, a circuit device comprising various signal lines, thin film transistors and a capacitor is provided by each sub pixel (P1, P2, P3). Especially, as described in FIG. 2, an active layer 110, a gate insulating layer 120, a gate electrode 130, an insulating interlayer 140, a source electrode 151, a drain electrode 152 and a passivation layer 160 may be provided.

The planarization layer 180 is provided on the circuit device layer 150, and the first electrode 200 is patterned on the planarization layer 180 by each sub pixel (P1, P2, P3). The first electrode 200 is connected with a source electrode or drain electrode of the driving thin film transistor provided in the circuit device layer 150.

The bank 210 is disposed to cover both ends of the first electrode 200 while being provided on the planarization layer 180. Herein, a portion of the upper surface of the first electrode 200, which are exposed without being covered by the bank 210, become an emission area.

A trench (T) of a groove structure is provided in the bank 210 and the planarization layer 180. The trench (T) may penetrate through the bank 210 in the boundary area between each of the sub pixels (P1, P2, P3), and may extend to a predetermined area of the planarization layer 180. Thus, the trench (T) may be manufactured by a process of removing the predetermined area of the planarization layer 180 and the bank 210. Also, although not shown, the trench (T) may extend to the inside of the circuit device layer 150 below the planarization layer 180.

The trench (T) is provided to disconnect at least a portion of the emission layer 220 from the remaining portion of the emission layer 220. That is, according as the at least a portion of the emission layer 220 are disconnectedly provided, it is possible to reduce a charge transfer between the neighboring sub pixels (P1, P2, P3) through the emission layer 220, to thereby reduce a leakage current between the neighboring sub pixels (P1, P2, P3). In order to make the at least a portion of the emission layer 220 disconnectedly provided in the trench (T), a depth (b) of the trench (T) is larger than a width (a) of the trench (T), in one embodiment.

The emission layer 220 is provided in the plurality of sub pixels (P1, P2, P3) and the boundary area between each of the plurality of sub pixels (P1, P2, P3). That is, the emission layer 220 is formed on the first electrode 200 and the bank 210, and is also formed on the planarization layer 180 inside the trench (T).

The emission layer 220 may be configured to emit white (W) colored light. To this end, the emission layer 220 may include a plurality of stacks configured to emit different colored light. In detail, the emission layer 220 may include a first stack 221 for emitting a first colored light, a second stack 223 for emitting a second colored light, and a charge generation layer (CGL) 222 provided between the first stack 221 and the second stack 223.

The emission layer 220 is formed inside the trench (T) and above the trench (T). According to one embodiment of the present disclosure, when the emission layer 220 is formed inside the trench (T), at least a portion of the emission layer 220 is disconnectedly provided so that it is possible to reduce an occurrence of leakage current in the area between the neighboring sub pixels (P1, P2, P3).

The first stack 221 may be formed at a lateral surface inside the trench (T), and also may be formed on a lower surface inside the trench (T).

In this case, with respect to the center of the trench (T), a first portion 221a of the first stack 221 formed at one lateral surface of the inside of the trench (T), for example, a left-sided lateral surface of the inside of the trench (T) is disconnected from a second portion 221b of the firsts tack 221 formed at the other lateral surface of the inside of the trench (T), for example, a right-sided lateral surface of the inside of the trench (T). Also, a third portion 221c of the first stack 221 formed on the lower surface of the inside of the trench (T) is disconnected from the first portion 221a and second portion 221b of the first stack 221 formed at the lateral surfaces of the inside of the trench (T). Accordingly, charges are not transferred through the first stack 221 in the area between the sub pixels (P1, P2, P3) which are disposed adjacent to each other under the condition that the trench (T) is interposed in-between.

Also, the charge generation layer 222 is formed on the first stack 221. In this case, the charge generation layer 222 may be formed only above the trench (T) without being provided inside the trench (T). That is, the charge generation layer 222 may be provided above an upper surface 210a of one end of the bank 210 through which the trench (T) penetrates. In other words, the charge generation layer 222 may be provided above the upper surface 210a of one end of the bank 210 being in contact with the trench (T), but not limited to this structure. The charge generation layer 222 may extend to the inside of the trench (T).

In this case, with respect to the center of the trench (T), a first portion 222a of the charge generation layer 222 formed at one lateral surface of the inside of the trench (T), for example, a left-sided lateral surface of the inside of the trench (T) is disconnected from a second portion 222b of the charge generation layer 222 formed at the other lateral surface of the inside of the trench (T), for example, a right-sided lateral surface of the inside of the trench (T). The first portion 222a of the charge generation layer 222 is formed on the first portion 221a of the first stack 221, and the second portion 222b of the charge generation layer 222 is formed on the second portion 221b of the first stack 221.

Accordingly, charges are not transferred through the charge generation layer 222 in the area between the sub pixels (P1, P2, P3) which are disposed adjacent to each other under the condition that the trench (T) is interposed in-between.

Also, the second stack 223 may be connectedly provided on the charge generation layer 222 without any disconnection in the area between the sub pixels (P1, P2, P3) which are disposed adjacent to each other under the condition that the trench (T) is interposed in-between. That is, with respect to the center of the trench (T), a first portion 223a of the second stack 223 formed at one lateral surface of the inside of the trench (T), for example, a left-sided lateral surface of the inside of the trench (T) is connected with a second portion 223b of the second stack 223 formed at the other lateral surface of the inside of the trench (T), for example, a right-sided lateral surface of the inside of the trench (T). Thus, charges are transferred through the second stack 223 in the area between the sub pixels (P1, P2, P3) which are disposed adjacent to each other under the condition that the trench (T) is interposed in-between.

In this case, a first thickness (d1) in the portion of the second stack 223 corresponding to the portion of the trench (T) in which the charge generation layer 222 is disconnectedly provided may be relatively smaller than a second thickness (d2) in the portion of the second stack 223 corresponding to the portion which is not overlapped with the trench (T). In other words, the first thickness (d1) in the portion of the second stack 223 being overlapped with the portion between the first portion 222a of the charge generation layer 222 and the second portion 222b of the charge generation layer 222 is relatively smaller than the second thickness (d2) in the first portion 223a or second portion 223b of the second stack 223 being overlapped with the bank 210.

The reason why the first thickness (d1) in the portion of the second stack 223 is relatively smaller is that the second stack 223 is deposited in such a way that the second stack 223 on the upper surface of the first portion 222a of the charge generation layer 222 is firstly spaced from the second stack 223 on the upper surface of the second portion 222b of the charge generation layer 222, and then meets with the second stack 223 on the upper surface of the second portion 222b of the charge generation layer 222. Thus, a portion of the lower portion of the second stack 223 formed in the relatively small first thickness (d1) may be disconnectedly provided above the trench (T). That is, a portion of the lower portion of the first portion 223a of the second stack 223 may be disconnected from a portion of the lower portion of the second portion 223b of the second stack 223.

A hole (H) is formed inside the trench (T) by the structure of the first stack 221, the charge generation layer 222 and the second stack 223. The hole (H) is defined by the planarization layer 180 and the emission layer 220, whereby the hole (H) is prepared below the emission layer 220. That is, the hole (H) prepared below the emission layer 220 is defined by the planarization layer 180, the first stack 221, the charge generation layer 222 and the second stack 223. The hole (H) extends from the inside of the trench (T) to the upper portion of the trench (T), and the end (HT) of the hole (H) is positioned relatively higher than the at least a portion of the emission layer 220 disconnectedly provided inside the trench (T). In detail, the end (HT) of the hole (H) is positioned relatively higher than the charge generation layer 222, whereby the first portion 222a of the charge generation layer 222 and the second portion 222b of the charge generation layer 222 are disconnected from each other by the hole (H).

Conductivity of the charge generation layer 222 is greater than conductivity of each of the first stack 221 and the second stack 223. Especially, an N-type charge generating layer for the charge generation layer 222 may include a metal material, whereby conductivity of the charge generation layer 222 is greater than conductivity of each of the first stack 221 and the second stack 223. Thus, a charge transfer between the neighboring sub pixels (P1, P2, P3) disposed adjacently is mainly made through the charge generation layer 222, and a charge transfer through the second stack 223 is insignificant. Thus, according to another embodiment of the present disclosure, the charge generation layer 222 is disconnectedly provided inside the trench (T) so that it is possible to largely decrease the charge transfer between the neighboring sub pixels (P1, P2, P3) disposed adjacently, to thereby reduce an occurrence of leakage current.

The second electrode 230 is formed in each sub pixel (P1, P2, P3) on the emission layer 220, and also formed in the boundary area between each of the sub pixels (P1, P2, P3) on the emission layer 220.

The encapsulation layer 300 is formed on the second electrode 230. In the same manner as those of the above embodiments, the encapsulation layer 300 may include a first encapsulation layer 310, a second encapsulation layer 320, a third encapsulation layer 330 and a fourth encapsulation layer 340.

The color filter layer 610, 620 and 630 are formed on the encapsulation layer 300. The color filter layer 610, 620 and 630 may include a red (R) color filter layer 610 provided in the first sub pixel (P1), a green (G) color filter layer 620 provided in the second sub pixel (P2), and a blue (B) color filter layer 630 provided in the third sub pixel (P3), but not limited to this structure. Meanwhile, although not shown, a black matrix may be additionally provided in the area between each of the color filter layers 610, 620 and 630 so that it is possible to reduce a light leakage in the boundary area between each of the sub pixels (P1, P2, P3).

Figure 7A:
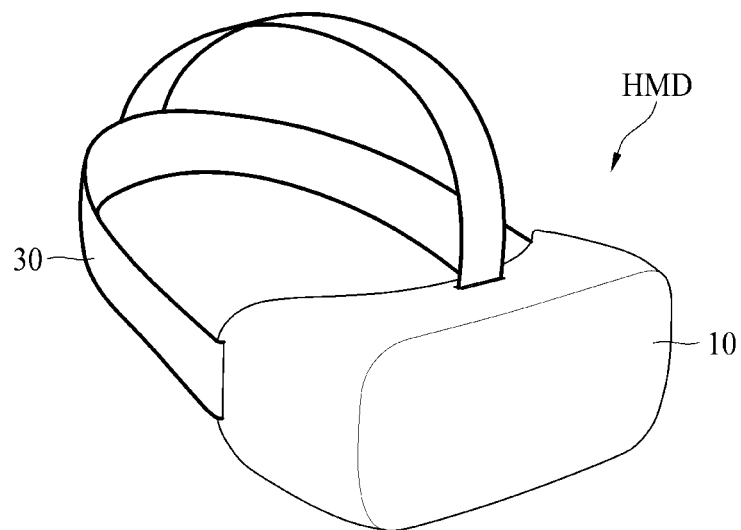
FIGS. 7A to 7C illustrate an electroluminescent display device according to another embodiment of the present disclosure.
Figure 7B:
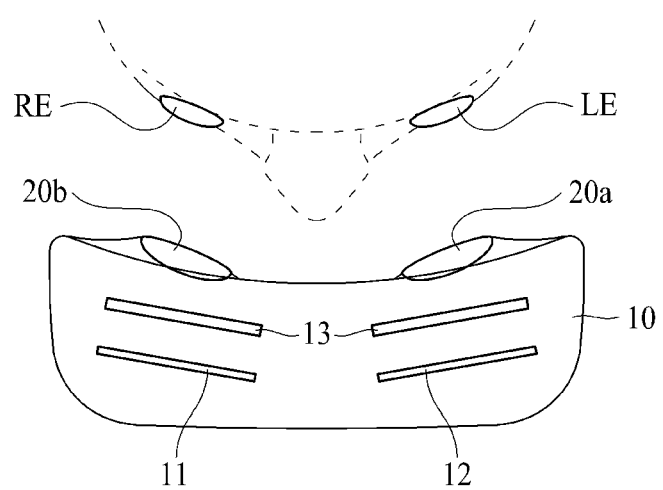
Figure 7C:
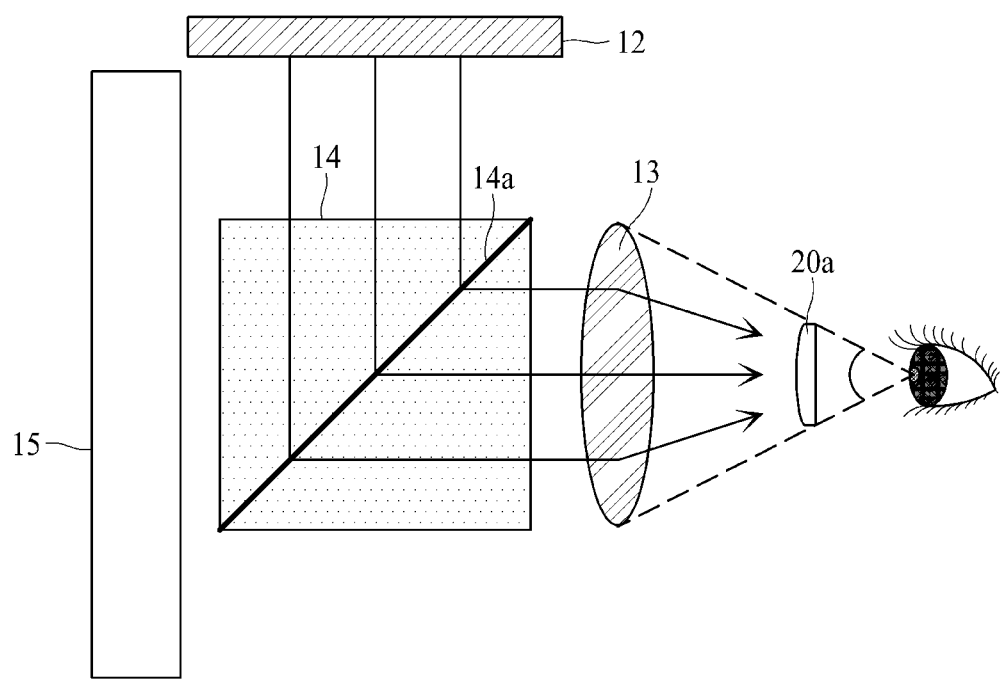

FIGS. 7A to 7C relate to an electroluminescent display device according to another embodiment of the present disclosure and relate to a head-mounted display (HMD) apparatus. FIG. 7A is a schematic perspective view, FIG. 7B is a schematic plan view of a virtual reality (VR) structure, and FIG. 7C is a schematic cross-sectional view of an augmented reality (AR) structure.

As seen in FIG. 7A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface and both side surfaces of a user, but is not limited thereto. The head-mounted band 30 may fix the HMD apparatus to a head of a user and may be replaced by a glasses frame type structure or a helmet type structure.

As seen in FIG. 7B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display device as explained above. In this case, an upper portion (for example, a color filter layer 610, 620 and 630) corresponding to a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 7C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 7C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display device as explained above. In this case, an upper portion (for example, a color filter layer 610, 620 and 630) corresponding to a surface displaying an image may face the transmissive reflection part 14.

The lens array 13 may be provided between the left-eye eyepiece lens 20*a* and the transmissive reflection part 14.

The left eye of the user may be located at the left-eye eyepiece lens 20*a*.

The transmissive reflection part 14 may be disposed between the lens array 13 and the transmissive window 15. The transmissive reflection part 14 may include a reflection surface 14*a* which transmits a portion of light and reflects the other portion of the light. The reflection surface 14*a* may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to one embodiment of the present disclosure, the protection layer is provided in the boundary area between each of the plurality of pad electrodes. Thus, for the process of removing the encapsulation layer and the passivation layer provided there below in order to expose the upper surface of the plurality of pad electrodes, the protection layer and the passivation layer provided there below remain so that it is possible to reduce damages on the peripheral area between each of the plurality of pad electrodes.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display device comprising:
    a substrate including a display area and a non-display area;
    an emission device in the display area on the substrate;
    an encapsulation layer extending from the display area to the non-display area, wherein the encapsulation layer is provided on the emission device;
    a plurality of pad electrodes in the non-display area on the substrate; and
    a protection layer provided in the area between each of the plurality of pad electrodes, and configured to protect a passivation layer disposed there below,
    wherein the encapsulation layer is provided with an opening area configured to expose at least a portion in each of the plurality of pad electrodes and at least a portion of the protection layer,
    wherein the passivation layer is provided between the protection layer and the plurality of pad electrodes, and
    wherein the passivation layer and the protection layer are provided with a contact area configured to expose at least the portion in each of the plurality of pad electrodes.

2. The electroluminescent display device according to claim 1, wherein the protection layer is formed of a conductive material.

3. The electroluminescent display device according to claim 1,
    wherein
    the protection layer and the passivation layer provided there below are overlapped with the plurality of pad electrodes.

4. The electroluminescent display device according to claim 1, wherein each of the plurality of pad electrodes is connected with an external driving circuit via the contact area, and the contact area is overlapped with the opening area.

5. The electroluminescent display device according to claim 1, wherein the opening area is formed in an extending straight-line structure while being overlapped with the plurality of pad electrodes and the protection layer.

6. The electroluminescent display device according to claim 5, wherein a size in the opening area is a same as or smaller than a size in an entire area including the plurality of pad electrodes and the protection layer.

7. The electroluminescent display device according to claim 1,
    wherein the encapsulation layer includes a first inorganic insulating layer, an organic insulating layer on the first inorganic insulating layer, and a second inorganic insulating layer on the organic insulating layer,
    the first inorganic insulating layer and the second inorganic insulating layer extend to one end of the substrate, and the organic insulating layer does not extend to one end of the substrate, and
    an upper surface of the first inorganic insulating layer and a lower surface of the second inorganic insulating layer are in contact with each other at one end of the substrate.

8. The electroluminescent display device according to claim 7, wherein a portion of the first inorganic insulating layer and a portion of the second inorganic insulating layer are overlapped with the pad electrode and the protection layer.

9. The electroluminescent display device according to claim 1,
    wherein the emission device includes a first electrode, a bank configured to surround a periphery of the first electrode, an emission layer provided on the first electrode and the bank, and a second electrode provided on the emission layer, and
    a portion of the emission layer are disconnectedly provided inside a trench in the bank.

10. The electroluminescent display device according to claim 1, further comprising a lens array spaced apart from the substrate, and an accommodating case for accommodating the substrate and the lens array therein.

11. An electroluminescent display device comprising:
a substrate including a display area and a non-display area;
an emission device in the display area on the substrate;
an encapsulation layer extending from the display area to the non-display area, wherein the encapsulation layer is provided on the emission device;
a plurality of pad electrodes in the non-display area on the substrate; and
a protection layer provided in the area between each of the plurality of pad electrodes, and configured to protect an insulating layer disposed there below,
wherein the encapsulation layer is provided with an opening area configured to expose at least a portion in each of the plurality of pad electrodes and at least a portion of the protection layer,
wherein each of the plurality of pad electrodes includes a first side confronting the display area, a second side extending from the first side and confronting a neighboring pad electrode, and a third side extending from the second side and being opposite to the first side, and
wherein the protection layer includes a plurality of first protection layers, wherein each of the plurality of first protection layers is provided between each of the plurality of pad electrodes, and
each of the plurality of first protection layers includes a first side confronting the display area, a second side extending from the first side and confronting one pad electrode, and a third side extending from the second side and being opposite to the first side.

12. The electroluminescent display device according to claim 11, wherein each of the plurality of first protection layers does not confront the first side of the plurality of pad electrodes.

13. The electroluminescent display device according to claim 11, wherein the second side in each of the plurality of first protection layers is overlapped with each of the plurality of pad electrodes.

14. The electroluminescent display device according to claim 11, wherein the first side in each of the plurality of first protection layers and the first side in each of the plurality of pad electrodes are positioned along a same extending line.

15. The electroluminescent display device according to claim 11, further comprising a second protection layer which is in contact with the third side in each of the plurality of first protection layers and confronts the third side in each of the plurality of pad electrodes.

16. The electroluminescent display device according to claim 15, wherein the opening area is overlapped with a portion of the first protection layer and a portion of the second protection layer.

17. An electroluminescent display device comprising:
a substrate including a display area and a non-display area;
a thin film transistor provided in the display area on the substrate, and configured to include an active layer, a gate electrode, a source electrode and a drain electrode;
a pad electrode provided in the non-display area on the substrate, and disposed in a same layer as the source electrode and the drain electrode;
a passivation layer extending from the display area to the non-display area, wherein the passivation layer is provided on the thin film transistor;
a protection layer provided on the passivation layer of the non-display area;
a planarization layer provided on the passivation layer of the display area;
an emission device provided in the planarization layer; and
an encapsulation layer extending from the display area to the non-display area, wherein the encapsulation layer is provided on the emission device,
wherein the encapsulation layer is provided with an opening area for exposing at least a portion of the pad electrode and at least a portion of the protection layer,
wherein the passivation layer is provided between the protection layer and the pad electrode, and
wherein the passivation layer and the protection layer are provided with a contact area configured to expose at least the portion of the pad electrode.

18. The electroluminescent display device according to claim 17,
wherein the emission device includes a first electrode, a second electrode, and an emission layer provided between the first electrode and the second electrode, and
the protection layer and the first electrode are formed of the same material.

19. The electroluminescent display device according to claim 17,
wherein the protection layer and the passivation layer provided there below are overlapped with the pad electrode, at least a portion of the pad electrode are connected with an external driving circuit via the contact area, and the contact area is overlapped with the opening area.

20. The electroluminescent display device according to claim 17, wherein a thickness of the encapsulation layer provided in the display area is larger than a thickness of the encapsulation layer provided in the non-display area, and the encapsulation layer provided in the non-display area is overlapped with one end of the substrate.

* * * * *